United States Patent
Teraoka

(10) Patent No.: US 11,930,605 B2
(45) Date of Patent: Mar. 12, 2024

(54) IN-VEHICLE ELECTRIC DEVICE

(71) Applicant: TOYOTA JIDOSHA KABUSHIKI KAISHA, Toyota (JP)

(72) Inventor: Yuuki Teraoka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/724,946

(22) Filed: Apr. 20, 2022

(65) Prior Publication Data
US 2022/0394865 A1 Dec. 8, 2022

(30) Foreign Application Priority Data
Jun. 3, 2021 (JP) ................................ 2021-093457

(51) Int. Cl.
*H05K 5/02* (2006.01)
*H05K 5/00* (2006.01)
*H05K 5/06* (2006.01)

(52) U.S. Cl.
CPC ......... *H05K 5/0204* (2013.01); *H05K 5/0013* (2013.01); *H05K 5/0247* (2013.01); *H05K 5/069* (2013.01)

(58) Field of Classification Search
None
See application file for complete search history.

(56) References Cited

U.S. PATENT DOCUMENTS

| | | | | |
|---|---|---|---|---|
| 7,762,415 | B2 * | 7/2010 | Matsui | H05K 5/0069 174/58 |
| 2005/0190539 | A1 * | 9/2005 | Watanabe | H05K 7/20854 361/704 |
| 2007/0230137 | A1 * | 10/2007 | Inagaki | B60R 16/0239 361/719 |
| 2011/0235289 | A1 * | 9/2011 | Watanabe | H05K 5/0052 361/752 |
| 2014/0334104 | A1 * | 11/2014 | Yang | H05K 5/0047 361/709 |
| 2015/0250072 | A1 * | 9/2015 | Ichikawa | H01R 13/6658 439/587 |
| 2015/0331087 | A1 * | 11/2015 | Philipp | H05K 5/0056 361/752 |

(Continued)

FOREIGN PATENT DOCUMENTS

| | | |
|---|---|---|
| JP | 2008-068696 A | 3/2008 |
| JP | 2008-074148 A | 4/2008 |

(Continued)

*Primary Examiner* — Xanthia C Relford
*Assistant Examiner* — Xanthia C Cunningham
(74) *Attorney, Agent, or Firm* — Oliff PLC

(57) ABSTRACT

An in-vehicle electric device of this disclosure is provided in a front compartment of a vehicle and includes: at least one electronic component; a case in which the electronic component is accommodated; a connector connected to the electronic component inside the case and projecting rearward from a surface of the case; a fastening portion extended from a lower part of the case and fastened to a vehicle body of the vehicle; and a protective wall formed integrally with the fastening portion such that the protective wall extends upward along a first side face of the connector from the lower part of the case and projects further rearward from a rear end surface of the connector.

9 Claims, 7 Drawing Sheets

(56) References Cited

U.S. PATENT DOCUMENTS

2018/0242479 A1* 8/2018 Miyao ................ H05K 5/0247

FOREIGN PATENT DOCUMENTS

| JP | 2013-103587 A | 5/2013 |
| JP | 2013-129220 A | 7/2013 |
| JP | 2019-084867 A | 6/2019 |
| JP | 2020-089189 A | 6/2020 |
| JP | 2021-109478 A | 8/2021 |

* cited by examiner

IN-VEHICLE ELECTRIC DEVICE

CROSS-REFERENCE TO RELATED APPLICATION

This application claims priority to Japanese Patent Application No. 2021-093457 filed on Jun. 3, 2021, incorporated herein by reference in its entirety.

BACKGROUND

1. Technical Field

This disclosure relates to an in-vehicle electric device including at least one electric component and a case in which the electric component is accommodated, the in-vehicle electric device being provided in a front compartment of a vehicle.

2. Description of Related Art

In the related art, as an in-vehicle electric device of this type, there has been known a power control unit fixed onto a transaxle in which a drive motor is accommodated inside a front compartment of a hybrid electric vehicle (e.g., see Japanese Unexamined Patent Application Publication No. 2019-084867 (JP 2019-084867 A)). A low-voltage connector is placed in a rear part of the top surface of the power control unit, and a metal windshield panel is placed behind the front compartment in the vehicle front-rear direction. Further, a pair of protectors extending rearward in the vehicle front-rear direction from the low-voltage connector is provided such that the protectors are placed on the opposite sides of the low-voltage connector of the power control unit. Hereby, when the power control unit moves rearward due a collision of the vehicle, the protectors push the windshield panel rearward, so that the low-voltage connector is protected.

SUMMARY

In the power control unit described in JP 2019-084867 A, a base portion of at least either one of the protectors is fixed, via a bolt, to an exclusive bolt seat extended from a side face of the power control unit. This increases the build of the whole device. In the meantime, in an electrified vehicle such as a hybrid electric vehicle or a battery electric vehicle, a mount space for the in-vehicle electric device in the front compartment may be limited due to a long wheel base achieved to secure a mount space for a battery, an increase in a maximum steering angle of front wheels along with the long wheel base, or the like. Accordingly, in a vehicle provided with the power control unit described in JP 2019-084867 A, workability (attachability) at the time when a connector is attached to the power control unit in a narrow mount space in the front compartment might not be secured well.

In view of this, a main object of this disclosure is to successfully secure the attachability of a connector to a case for an in-vehicle electric device and to achieve protection of the connector projecting rearward from the surface of the case.

An in-vehicle electric device according to this disclosure is an in-vehicle electric device including at least one electronic component and a case in which the electronic component is accommodated, the in-vehicle electric device being provided in a front compartment of a vehicle. The in-vehicle electric device includes a connector, a fastening portion, and a protective wall. The connector is connected to the electronic component inside the case and projecting rearward from a surface of the case. The fastening portion is extended from a lower part of the case and fastened to a vehicle body of the vehicle. The protective wall is formed integrally with the fastening portion such that the protective wall extends upward along a first side face of the connector from the lower part of the case and projects further rearward from a rear end surface of the connector.

The in-vehicle electric device according to this disclosure includes at least one electronic component, and the case in which the electronic component is accommodated, and the in-vehicle electric device is provided in the front compartment of the vehicle. Further, the in-vehicle electric device includes the connector, the fastening portion, and the protective wall. The connector is connected to the electronic component inside the case and projects rearward from the surface of the case. The fastening portion is extended from the lower part of the case and fastened to the vehicle body of the vehicle. The protective wall is formed integrally with the fastening portion such that the protective wall extends upward along the first side face of the connector from the lower part of the case and projects further rearward from the rear end surface of the connector. Hereby, it is possible to restrain an increase in the build of the whole in-vehicle electric device and to successfully secure workability (attachability) at the time when the connector is attached to the case in a narrow mount space in the front compartment. Further, at the time when the in-vehicle electric device moves rearward due to a collision of the vehicle, the connector is protected such that the protective wall collides with a member provided behind earlier than the connector and pushes the member aside. As a result, it is possible to successfully secure the attachability of the connector to the case of the in-vehicle electric device and to achieve protection of the connector projecting rearward from the surface of the case. In addition, when the protective wall is formed integrally with the fastening portion of the case, it is possible to restrain an increase in cost due to an increase in the weight of the in-vehicle electric device and an increase in the number of components.

Further, the case may include a lower case including the fastening portion and the protective wall, and an upper case connected to an upper end part of the lower case. The upper case may include a second protective wall extending rearward along the first side face of the connector and projecting further rearward from the rear end surface of the connector. Hereby, it is possible to successfully restrain a load from being applied to the first side face or the rear end surface of the connector when the vehicle has a collision.

Further, the protective wall and the second protective wall may at least partially overlap with each other when the in-vehicle electric device is viewed from above.

Further, a gap through which a tool is passable may be formed between the protective wall and the second protective wall in the up-down direction. This makes it possible to successfully secure workability at the time when the connector is attached to the case of the in-vehicle electric device in a narrow mount space in the front compartment.

Further, the upper case may include a third protective wall extending rearward along a second side face opposite to the first side face of the connector and projecting further rearward from the rear end surface of the connector. Hereby, at the time when the in-vehicle electric device moves rearward due to a collision of the vehicle, the third protective wall collides with the member provided behind earlier than the connector and pushes the member aside, in addition to the protective wall and the second protective wall. This makes it possible to extremely successfully protect the connector.

Further, each of the protective wall, the second protective wall, and the third protective wall may be extended from a corresponding one of the lower case and the upper case such that the each of the protective wall, the second protective wall, and the third protective wall reaches a plane facing the rear end surface of the connector via an interval.

Further, the vehicle may include an in-vehicle component placed behind the connector via an interval. An interval between the protective wall and the third protective wall in the width direction of the vehicle and an interval between the second protective wall and the third protective wall in the width direction may be shorter than the dimension of the in-vehicle component in the width direction. Hereby, at the time when the in-vehicle electric device moves rearward due to a collision of the vehicle, it is possible to successfully restrain the in-vehicle component from colliding with the connector placed between the third protective wall and each of the protective wall and the second protective wall.

Further, the second and third protective walls may be formed in the upper case such that the second and third protective walls are displaced from each other in the up-down direction. The connector may include a connector body placed between the second and third protective walls, a first projecting portion extended from the connector body such that the first projecting portion is placed above or below the second protective wall, and a second projecting portion extended from the connector body such that the second projecting portion is placed below or above the third protective wall. Hereby, at the time when the connector is attached to the case, it is possible to restrict the movement of the connector body in the width direction of the vehicle by the second and third protective walls and to restrict the movement, in the up-down direction, of the first and second projecting portions, that is, the connector body. As a result, it is possible to achieve protection of the connector and to easily attach the connector to the case while the connector is restrained from making contact with members around the connector.

Further, the third protective wall may be formed in the upper case such that the third protective wall is displaced downward from the second protective wall. The first projecting portion may be extended from the connector body such that the first projecting portion is placed below the second protective wall, the first projecting portion being fastened to the upper case. The second projecting portion may be extended from the connector body such that the second projecting portion is placed above the third protective wall, the second projecting portion being fastened to the upper case. The connector may further include a third projecting portion extended from the connector body such that the third projecting portion is placed above the protective wall, and a fourth projecting portion extended from the connector body such that the fourth projecting portion is placed below the third protective wall.

Further, the vehicle may be an electrified vehicle including an electric machine configured to output a driving force to wheels, and a battery configured to supply electric power to the electric machine. The connector may be used to connect the in-vehicle electric device to the battery or a power control unit configured to drive the electric machine. That is, in the in-vehicle electric device according to this disclosure, when the vehicle has a collision, it is possible to successfully protect the connector as a high-voltage component.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

With reference to the drawings, the following describes an embodiment to carry out the disclosure of this disclosure.

Figure 1:
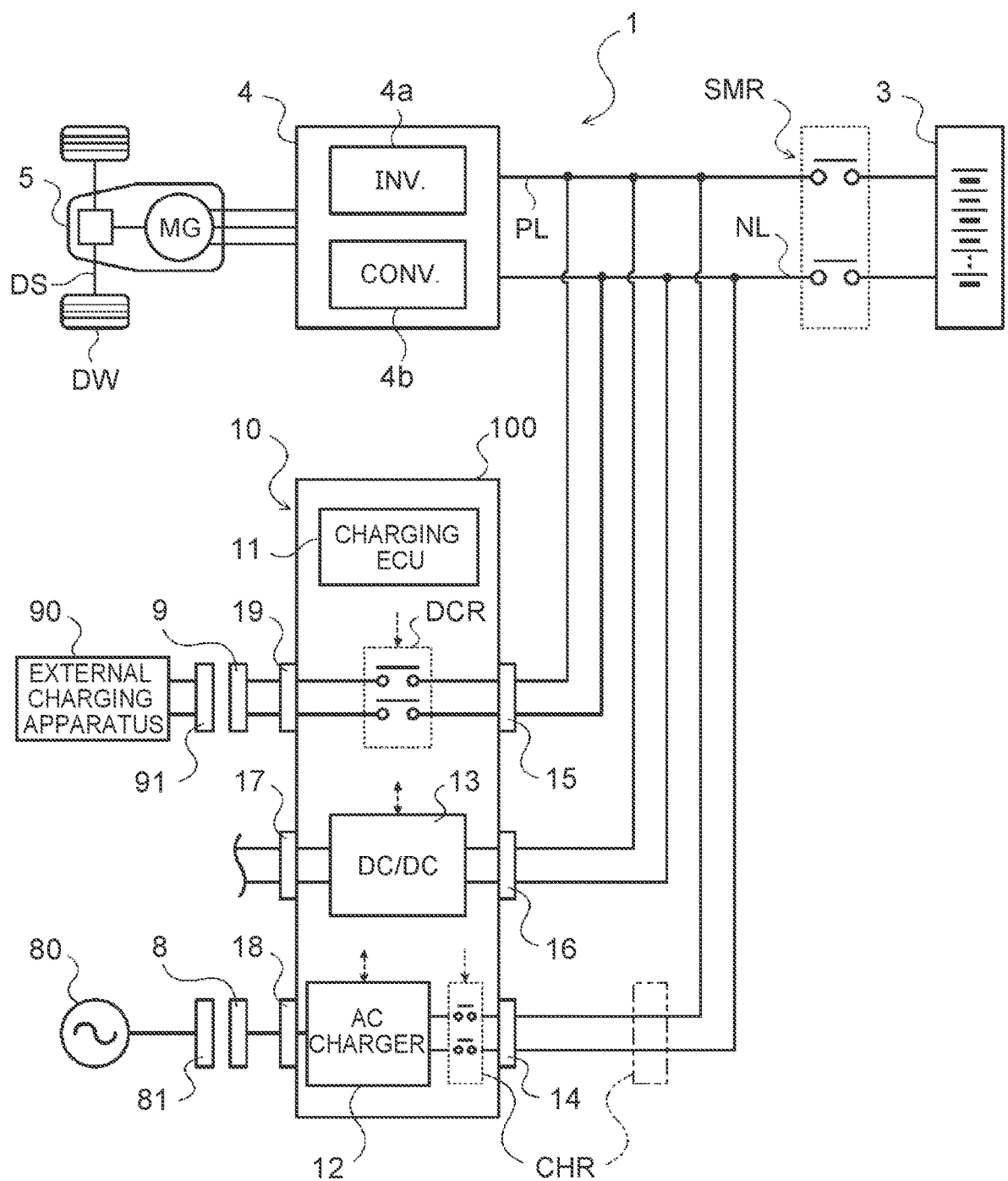
FIG. 1 is a schematic configuration diagram illustrating a vehicle equipped with an in-vehicle electric device according to this disclosure.

FIG. 1 is a schematic configuration diagram illustrating a battery electric vehicle 1 that is a vehicle equipped with a power supply unit (hereinafter referred to as "ESU") 10 as an in-vehicle electric device according to this disclosure. The battery electric vehicle 1 illustrated in FIG. 1 includes a battery (high-voltage battery) 3, a system main relay SMR, a power control unit (hereinafter referred to as "PCU") 4, and a motor generator MG, in addition to the ESU 10. The battery electric vehicle 1 is a front-wheel-drive vehicle in the present embodiment, but the battery electric vehicle 1 may be a rear-wheel-drive vehicle or a four-wheel-drive vehicle.

The battery 3 includes a plurality of battery modules (cell stacks) connected in series, and a battery outer case in which the battery modules are accommodated. For example, the battery 3 is provided under the floor (under a floor panel) of the battery electric vehicle 1 near a rear seat. Each of the battery modules in the battery 3 includes a plurality of battery cells (not illustrated) connected in parallel or in series, and each of the battery cells is, for example, a lithium-ion secondary battery, a nickel hydride secondary battery, or the like. A positive-electrode-side power line PL is connected to a positive terminal of the battery 3 via a positive-side relay of the system main relay SMR, and a negative-electrode-side power line NL is connected to a negative terminal of the battery 3 via a negative-side relay of the system main relay SMR.

The PCU 4 is connected to the battery 3 via the positive-electrode-side power line PL, the negative-electrode-side power line NL, and the system main relay SMR. The PCU 4 includes an inverter (drive circuit) 4a configured to drive the motor generator MG, a boost converter 4b configured to increase the voltage of electric power from the battery 3 and to decrease the voltage from the motor generator MG side, a dischargeable and chargeable capacitor (not illustrated), and so on.

The motor generator MG is a synchronous generator-motor (three-phase motor). A rotor of the motor generator MG is connected to a drive shaft DS connected to a driving wheel DW via a gear mechanism including a speed reducer and a differential gear. The motor generator MG is driven by electric power from the PCU 4 (the battery 3) so as to output a driving torque (driving force) to the drive shaft DS, and at the time of braking of the battery electric vehicle 1, the motor generator MG outputs a regenerative braking torque to the drive shaft DS. In the present embodiment, the motor generator MG, the speed reducer, and the differential gear are accommodated in a transaxle case and constitutes a transaxle 5 together with the transaxle case.

The ESU 10 is provided in the battery electric vehicle 1 such that the battery 3 is chargeable by electric power from an alternating-current power source 80 such as a household power source or an external charging apparatus (a direct-current power source) 90 such as a quick charger provided in a filling station. As illustrated in FIG. 1, the ESU 10 includes a charging control device (charging ECU) 11, an AC charger 12, charging relays CHR, DCR, a DC-DC converter 13, a bus bar unit (not illustrated), and a case 100 in which these electronic components are accommodated. The charging control device 11 is a microcomputer including a CPU, a ROM, a RAM, and so on (not illustrated) and is configured to control the AC charger 12 and the DC-DC converter 13 and to control opening and closing of the charging relays CHR, DCR.

The AC charger 12 includes an AC-DC converter (not illustrated) configured to convert alternating-current power into direct-current power, a DC-DC converter (not illustrated) configured to increase direct-current power output from the AC-DC converter, and so on. The AC-DC converter of the AC charger 12 is connected to a plug 8 connectable to an outlet 81 of the alternating-current power source 80 via a connector 18 attached to the case 100 and a cable. Further, the DC-DC converter of the AC charger 12 is connected to the positive-electrode-side power line PL and the negative-electrode-side power line NL between the system main relays SMR and the PCU 4 via the charging relay CHR, a connector 14 attached to the case 100, and power lines. When the AC charger 12 is activated in a state where the plug 8 is connected to the outlet 81 and the system main relay SMR and the charging relay CHR are closed, the battery 3 can be charged by electric power (alternating-current power) from the alternating-current power source 80.

The charging relay DCR is connected to the positive-electrode-side power line PL and the negative-electrode-side power line NL between the system main relay SMR and the PCU 4 via a connector 15 attached to the case 100 and power lines. Further, the charging relay DCR is connected to a power receiving connector 9 via a connector 19 attached to the case 100 and cables. The power receiving connector 9 can be connected to a transmission connector 91 of an external charging apparatus 90, and the power receiving connector 9 is provided in a charging lid (not illustrated) of the battery electric vehicle 1. When the transmission connector 91 is connected to the power receiving connector 9, and the external charging apparatus 90 is activated in a state where the system main relay SMR and the charging relay DCR are closed, the battery 3 can be charged by electric power (direct-current power) from the external charging apparatus 90.

The DC-DC converter 13 is connected to the positive-electrode-side power line PL and the negative-electrode-side power line NL between the system main relay SMR and the PCU 4 via a connector 16 attached to the case 100 and power lines. Further, an output terminal of the DC-DC converter 13 is connected to an auxiliary battery (a low-voltage battery) and various accessories (not illustrated) via a connector 17 attached to the case 100 and power lines. Hereby, electric powers from the positive-electrode-side power line PL and the negative-electrode-side power line NL are decreased in voltage by the DC-DC converter 13 and can be supplied to the auxiliary battery or various accessories.

Figure 2:
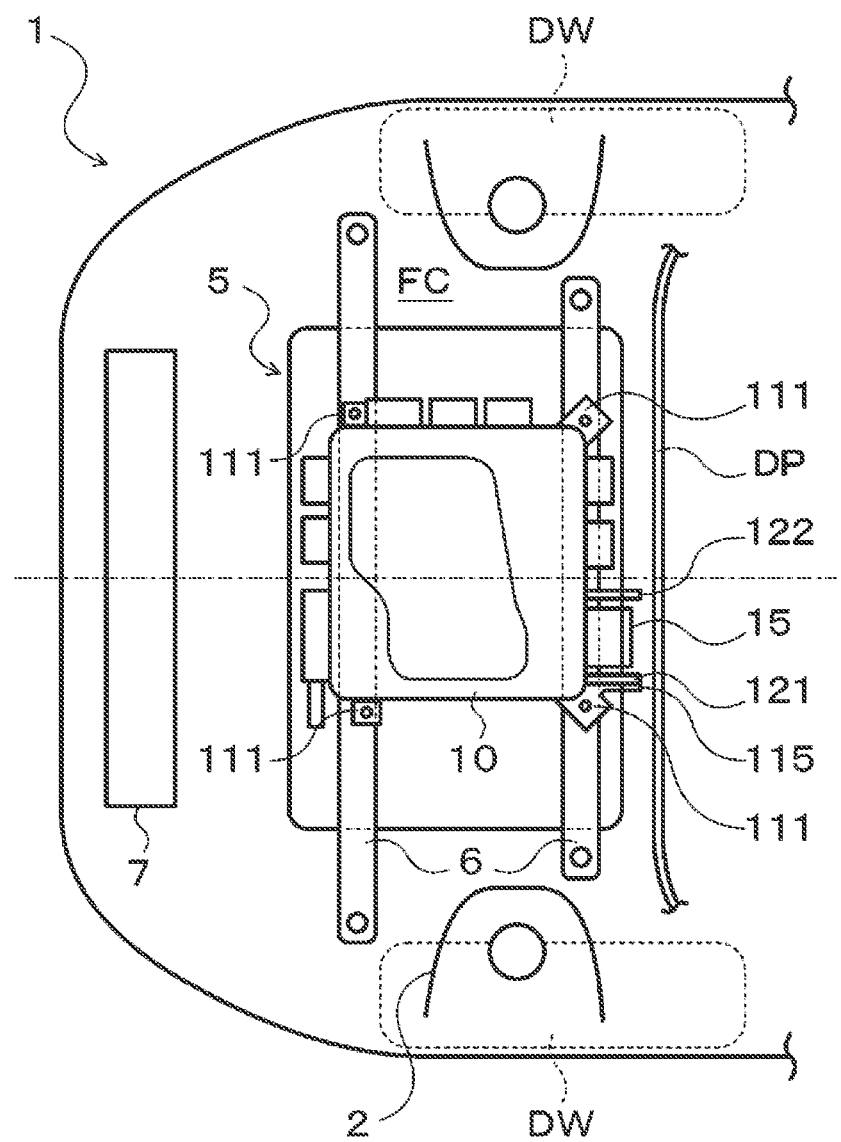
FIG. 2 is a plan view illustrating the vehicle equipped with the in-vehicle electric device according to this disclosure.

The ESU 10 as described above is provided in a front compartment FC of the battery electric vehicle 1 together with the transaxle 5 as illustrated in FIG. 2. That is, in the present embodiment, two beam members 6 are fixed to a vehicle body (monocoque) 2 of the battery electric vehicle 1 such that the two beam members 6 extend in parallel to each other in the vehicle width direction of the battery electric vehicle 1 above the transaxle 5 inside the front compartment FC. Then, the ESU 10 is fastened (fixed) via a plurality of bolts to the two beam members 6 (the vehicle body 2) such that the ESU 10 is placed above the transaxle 5, behind a radiator 7, and in front of a dash panel (a partition wall) DP.

Figure 3:
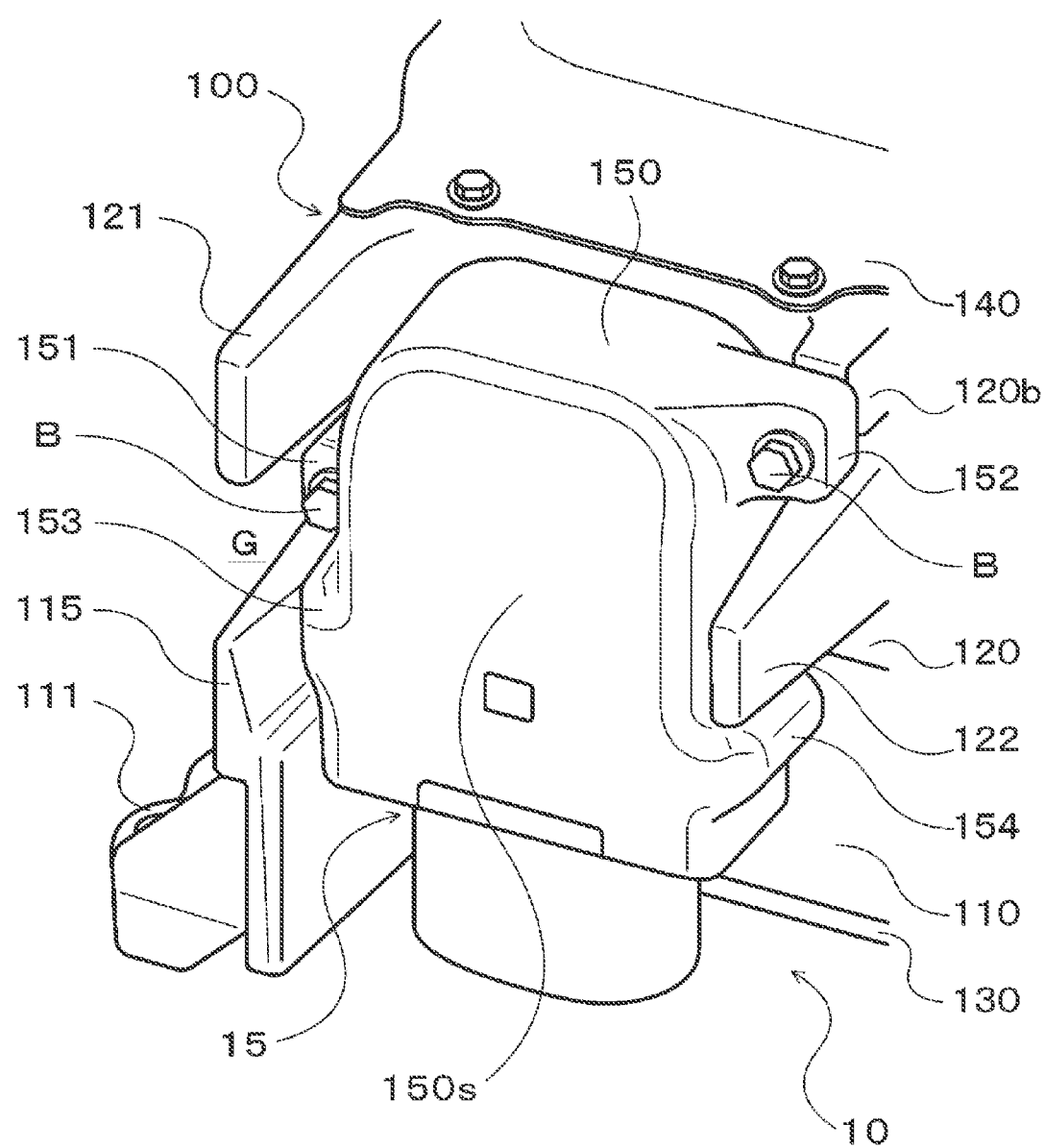
FIG. 3 is an enlarged perspective diagram illustrating an essential part of the in-vehicle electric device according to this disclosure.
Figure 4:
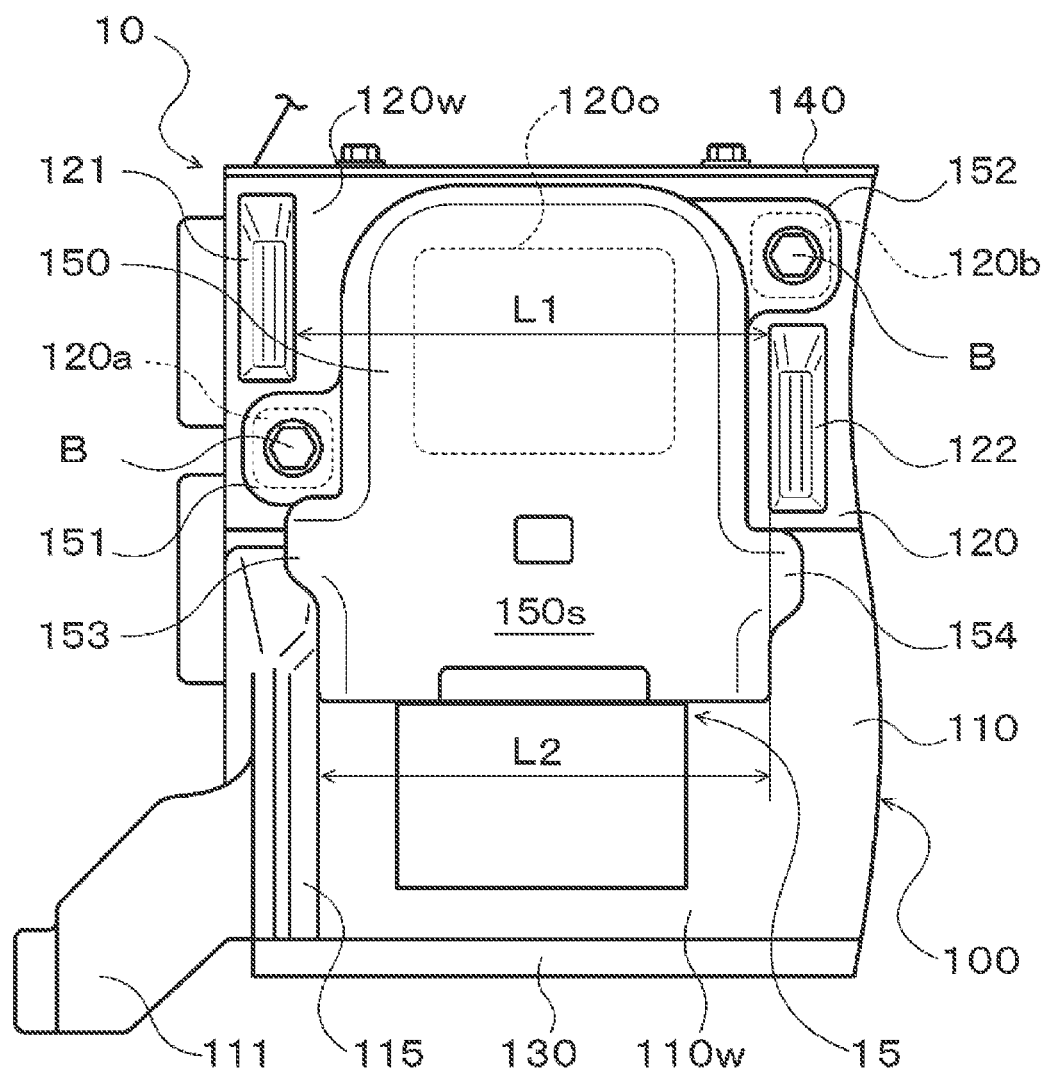
FIG. 4 is an enlarged view of the in-vehicle electric device according to this disclosure when the in-vehicle electric device is viewed from the rear side.
Figure 5:
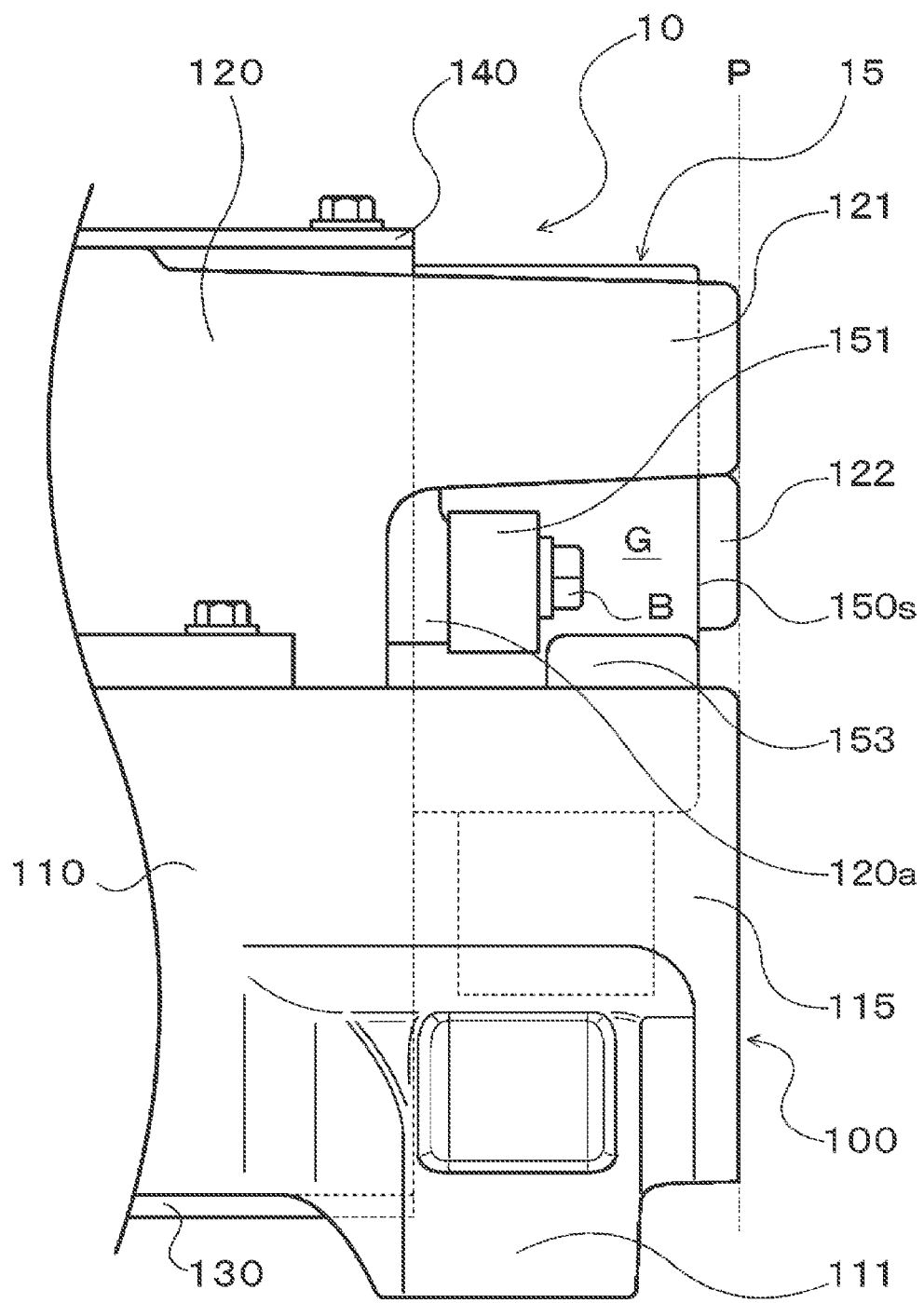
FIG. 5 is an enlarged view of the in-vehicle electric device according to this disclosure when the in-vehicle electric device is viewed from a lateral side.

FIG. 3 is an enlarged perspective diagram illustrating an essential part of the ESU 10, FIG. 4 is an enlarged view illustrating the ESU 10 viewed from the rear side, and FIG. 5 is an enlarged view illustrating the ESU 10 viewed from a lateral side.

As illustrated in FIGS. 3 to 5, the case 100 of the ESU 10 includes a square-cylindrical lower case 110, a bottomed square-cylindrical upper case 120, a lower cover 130, and an upper cover 140. In the present embodiment, the lower case 110 and the upper case 120 are casting products made of aluminum alloy or the like, and the lower cover 130 and the upper cover 140 are made of a steel sheet or the like. The upper case 120 is connected (fixed) to an upper end part of the lower case 110 via a plurality of bolts. The lower cover 130 is connected (fixed) to a lower end part of the lower case 110 via a plurality of bolts and forms a bottom portion of the lower case 110. The upper cover 140 is connected (fixed) to an upper end part of the upper case 120 via a plurality of bolts and covers the upper case 120. Further, the AC charger 12, the DC-DC converter 13, the charging relay CHR, and so on are accommodated inside the lower case 110, for example, and the charging control device 11, the charging relay DCR, the bus bar unit, and so on are accommodated inside the upper case 120, for example. However, for example, the charging relay CHR may be placed outside the case 100 as indicated by an alternate long and two short dashes line in FIG. 1.

The lower case 110 includes a plurality of (e.g., four in the present embodiment) fastening portions 111 (see FIG. 2) projecting outward from lower parts (lower edge parts) of their corresponding corner portions of the lower case 110. The fastening portions 111 are each fastened (fixed) to its corresponding one of the beam members 6 via a bolt. Further, the upper case 120 has a connection opening 120o (see FIG. 4) into which the connector 15 is inserted. The connector 15 connects the charging relay DCR for quick charge to the positive-electrode-side and negative-electrode-side power lines PL, NL (the battery 3). The connection opening 120o is formed in a first end (in the present embodiment, an end on a left lateral face side of the battery electric vehicle 1) of a side wall portion (a rear wall portion) 120w (see FIG. 4) of the upper case 120. The side wall portion 120w extends in the vehicle width direction on a side closer to the rear part of the battery electric vehicle 1 and faces the dash panel DP when the fastening portions 111 of the lower case 110 is fastened to their corresponding beam members 6.

Further, the upper case 120 includes an outer protective wall (a second protective wall) 121, an inner protective wall (a third protective wall) 122, a first boss portion 120a, and a second boss portion 120b. As illustrated in FIG. 4, the outer protective wall 121 is formed in the upper case 120 such that the outer protective wall 121 is placed on a lateral side from the connection opening 120o and projects rearward from a first end (a left end in the present embodiment) of the side wall portion 120w. Further, the inner protective wall 122 is formed in the upper case 120 such that the inner protective wall 122 is provided on a side opposite to the outer protective wall 121 across the connection opening 120o and projects rearward from the side wall portion 120w. In the present embodiment, the outer protective wall 121 is formed in the upper case 120 such that the outer protective wall 121 is placed near the upper end part of the upper case 120, and the inner protective wall 122 is formed in the upper case 120 such that the inner protective wall 122 is displaced downward from the outer protective wall 121. Further, an interval L1 (see FIG. 4) between the outer protective wall 121 and the inner protective wall 122 in the vehicle width direction is shorter than the dimension, in the vehicle width direction, of the dash panel DP placed behind the ESU 10. Further, as illustrated in FIG. 4, the first boss portion 120a of the upper case 120 is formed in the side wall portion 120w such that the first boss portion 120a is placed below the outer protective wall 121. Further, the second boss portion 120b is formed in the side wall portion 120w such that the second boss portion 120b is placed above the inner protective wall 122. Threaded holes with which bolts B are engaged threadedly are formed in the first and second boss portions 120a, 120b.

In the meantime, the connector 15 includes a connector body 150 including a plug portion (not illustrated) to be inserted into the connection opening 120o of the side wall portion 120w. The connector body 150 has a width shorter than the interval L1 between the outer and inner protective walls 121, 122 of the upper case 120. When the connector 15 is inserted into the connection opening 120o, the connector body 150 projects rearward from the surface of the side wall portion 120w between the outer and inner protective walls 121, 122.

Further, as illustrated in FIGS. 3, 4, the connector 15 includes a first projecting portion 151 extended in the width direction and outwardly from a first side face (a left side face in FIG. 4) of the connector body 150, and a second projecting portion 152 extended in the width direction and outwardly from a second side face (a right side face in FIG. 4) of the connector body 150. The first projecting portion 151 is formed in the connector body 150 such that the first projecting portion 151 is placed below the outer protective wall 121 of the upper case 120 when the connector 15 is inserted into the connection opening 120o. In the meantime, the second projecting portion 152 is formed in the connector body 150 so as to be displaced upward from the first projecting portion 151 such that the second projecting portion 152 is placed above the inner protective wall 122 of the upper case 120 when the connector 15 is inserted into the connection opening 120o. Respective bolt holes through which shaft portions of bolts B are passed are formed in the first and second projecting portions 151, 152.

Further, as illustrated in FIGS. 3, 4, the connector 15 includes a third projecting portion 153 extended in the width direction and outwardly from the first side face (the left side face in FIG. 4) of the connector body 150, and a fourth projecting portion 154 extended in the width direction and outwardly from the second side face (the right side face in FIG. 4) of the connector body 150. The third projecting portion 153 is formed in the connector body 150 such that the third projecting portion 153 is placed behind and below the first projecting portion 151. Further, the fourth projecting portion 154 is formed in the connector body 150 such that the fourth projecting portion 154 is placed behind and below the second projecting portion 152. When the connector 15 is inserted into the connection opening 120o, the fourth projecting portion 154 is placed below the inner protective wall 122 of the upper case 120.

In the ESU 10 of the present embodiment, a protective wall 115 is formed in the lower case 110. The protective wall 115 is formed integrally with the fastening portion 111 close to a first end (a left end in the present embodiment) of a side wall portion 110w of the lower case 110 that is placed below the side wall portion 120w of the upper case 120, such that the protective wall 115 projects rearward from the first end of the side wall portion 110w. Further, as can be seen from FIGS. 3, 4, when the ESU 10 is viewed from above, the protective wall 115 of the lower case 110 at least partially overlaps with the outer protective wall 121 of the upper case 120, and as illustrated in FIGS. 3, 5, a gap G is formed between the protective wall 115 and the outer protective wall 121 in the up-down direction. Further, an interval L2 (see FIG. 4) between the protective wall 115 and the inner protective wall 122 in the vehicle width direction is shorter than the dimension, in the vehicle width direction, of the dash panel DP placed behind the ESU 10.

The connector 15 of the ESU 10 configured as described above is connected to the positive-electrode-side power line PL and the negative-electrode-side power line NL (the battery 3) via power lines. After the case 100 is fixed to the beam members 6 (the vehicle body 2), the connector 15 is attached to the upper case 120 of the case 100. At the time when the connector 15 is inserted into the connection opening 120o, the first and third projecting portions 151, 153 of the connector body 150 are inserted into the gap G between the protective wall 115 of the lower case 110 and the outer protective wall 121 of the upper case 120, and the inner protective wall 122 of the upper case 120 is inserted into a gap between the second and fourth projecting portions 152, 154 of the connector body 150. Hereby, the movement of the connector body 150 in the vehicle width direction is restricted by the outer and inner protective walls 121, 122. Further, the movement of the first and third projecting portions 151, 153 of the connector body 150 in the up-down direction, that is, the movement of the connector body 150 in the up-down direction is restricted by the protective wall 115 and the outer protective wall 121, and the movement of the second and fourth projecting portions 152, 154 in the up-down direction, that is, the movement of the connector body 150 in the up-down direction is restricted by the inner protective wall 122.

As a result, the connector 15 (the connector body 150) can be easily inserted into the upper case 120 (the case 100) while the connector 15 is restrained from making contact with members around the connector 15. Further, after the connector 15 is inserted into the upper case 120, the bolts B are passed through the bolt holes of the first and second projecting portions 151, 152, and the bolts B are threadedly engaged with the first and second boss portions 120a, 120b of the upper case 120, respectively. At this time, in the ESU 10, the bolt B passed through the first projecting portion 151 can be threadedly engaged with the first boss portion 120a by passing a fastening tool through the gap G between the protective wall 115 and the outer protective wall 121. Hereby, it is possible to successfully secure workability (attachability) at the time when the connector 15 is attached to the case 100 of the ESU 10 in a narrow mount space in the front compartment FC, and it is possible to rigidly fix the connector 15 to the case 100 (the upper case 120).

At the time when the connector 15 is attached to the case 100, the protective wall 115 of the lower case 110 extends upward along the first side face of the connector body 150 (the connector 15) from a lower part of the lower case 110 and projects further rearward from a rear end surface 150s of the connector body 150 (the connector 15), as illustrated in FIGS. 3, 5. Further, as illustrated in FIGS. 3, 5, the outer protective wall 121 of the upper case 120 extends rearward along the first side face of the connector body 150 and projects further rearward from the rear end surface 150s of the connector body 150, and the inner protective wall 122 of the upper case 120 extends rearward along the second side face of the connector body 150 and projects further rearward from the rear end surface 150s of the connector body 150. Further, as illustrated in FIG. 5, respective end parts of the protective wall 115 and the outer and inner protective walls 121, 122 reach a virtual plane P facing the rear end surface 150s of the connector body 150 via an interval.

Hereby, when the battery electric vehicle 1 has a collision (a front collision, an oblique collision, an offset collision, or the like), and the ESU 10 moves rearward due to the collision, the protective wall 115 of the lower case 110 and the outer protective wall (the second protective wall) 121 and the inner protective wall (the third protective wall) 122 of the upper case 120 collide with the dash panel DP behind earlier than the connector 15 and push the dash panel DP aside. As a result, it is possible to extremely successfully protect the connector 15 as a high-voltage component projecting rearward from the side wall portion 120w. Further, when the battery electric vehicle 1 has a collision, it is possible to successfully restrain, by the protective wall 115 and the outer protective wall 121, a load from being applied to the first side face (a whole side face) and the rear end surface of the connector body 150 (the connector 15), and it is also possible to successfully restrain, by the inner protective wall 122, a load from being applied to the second side face of the connector body 150.

As described above, the ESU 10 includes a plurality of electronic components such as the AC charger 12, the charging relays CHR, DCR, and the DC-DC converter 13, and the case 100 in which the electronic components are accommodated, and the ESU 10 is provided in the front compartment FC of the battery electric vehicle 1. Further, the ESU 10 includes: the connector 15 connected to the charging relay DCR inside the upper case 120 (the case 100) and projecting rearward from the surface of the side wall portion 120w of the upper case 120; the fastening portions 111 extended from the lower part of the lower case 110 (the case 100) and fastened to the vehicle body 2 (the beam members 6); and the protective wall 115 formed in the lower case 110.

In the ESU 10, the protective wall 115 is formed integrally with any of the fastening portions 111 that is provided close to the connector 15, such that the protective wall 115 extends upward along the first side face of the connector 15 from the lower part of the case 100, that is, the lower case 110 and projects further rearward from the rear end surface 150s of the connector 15. Hereby, it is possible to restrain an increase in the build of the whole ESU 10 and to successfully secure workability (attachability) at the time when the connector 15 is attached to the upper case 120 in a narrow mount space in the front compartment FC. Further, when the ESU 10 moves rearward due to a collision of the battery electric vehicle 1, the protective wall 115 collides with the dash panel DP behind earlier than the connector 15 and pushes the dash panel DP aside, so that the connector 15 is protected. This consequently allows the ESU 10 to successfully secure the attachability of the connector 15 to the case 100 and to achieve protection of the connector 15 projecting rearward from the surface of the case 100. In addition, when the protective wall 115 is formed integrally with any of the fastening portions 111, it is possible to restrain an increase in cost due to an increase in the weight of the ESU 10 and an increase in the number of components.

Further, the case 100 of the ESU 10 includes the lower case 110 including the fastening portions 111 and the protective wall 115, and the upper case 120 connected to the upper end part of the lower case 110. The upper case 120 includes the outer protective wall 121 as the second protective wall extending rearward along the first side face of the connector 15 (the connector body 150) and projecting further rearward from the rear end surface 150s of the connector 15. Hereby, by the protective wall 115 of the lower case 110 and the outer protective wall 121 of the upper case 120, it is possible to successfully restrain a load from being applied to the first side face (the whole side face) and the rear end surface of the connector 15 at the time when the battery electric vehicle 1 has a collision.

Further, when the ESU 10 is viewed from above, the protective wall 115 at least partially overlaps with the outer protective wall 121, and the gap G through which a fastening tool is passable is formed between the protective wall 115 and the outer protective wall 121 in the up-down direction. This makes it possible to successfully secure workability at the time when the connector 15 is attached to the case 100 of the ESU 10 in a narrow mount space in the front compartment FC.

Further, the upper case 120 includes the inner protective wall 122 extending rearward along the second side face opposite to the first side face of the connector 15 and projecting further rearward from the rear end surface 150s of the connector 15. The inner protective wall 122 extends from the lower case 110 or the upper case 120 so as to reach the virtual plane P facing the rear end surface 150s of the connector 15 via an interval, similarly to the protective wall 115 and the outer protective wall 121. Hereby, at the time when the ESU 10 moves rearward due to a collision of the battery electric vehicle 1, the inner protective wall 122 collides with the dash panel DP behind earlier than the connector 15 and pushes the dash panel DP aside, in addition to the protective wall 115 and the outer protective wall 121. This makes it possible to extremely successfully protect the connector 15.

Further, the battery electric vehicle 1 includes the dash panel DP as an in-vehicle component placed behind the connector 15 of the ESU 10 via an interval. The interval L1 between the outer protective wall 121 and the inner protective wall 122 in the vehicle width direction and the interval L2 between the protective wall 115 and the inner protective wall 122 in the vehicle width direction are shorter than the dimension, in the vehicle width direction, of the dash panel DP placed behind the ESU 10. Hereby, at the time when the ESU 10 moves rearward due to a collision of the battery electric vehicle 1, it is possible to successfully restrain the dash panel DP from colliding with the connector 15 placed between the inner protective wall 122 and each of the protective wall 115 and the outer protective wall 121.

Further, in the ESU 10, the inner protective wall 122 is formed in the upper case 120 such that the inner protective wall 122 is displaced downward from the outer protective wall 121. Further, the connector 15 includes: the connector body 150 placed between the outer and inner protective walls 121, 122; the first projecting portion 151 extended from the connector body 150 such that the first projecting portion 151 is placed below the outer protective wall 121; the second projecting portion 152 extended from the connector body 150 such that the second projecting portion 152 is placed above the inner protective wall 122; the third projecting portion 153 extended from the connector body 150 such that the third projecting portion 153 is placed above the protective wall 115; and the fourth projecting portion 154 extended from the connector body 150 such that the fourth projecting portion 154 is placed below the inner protective wall 122. Hereby, it is possible to achieve protection of the connector 15 and to easily attach the connector 15 to the case 100 while the connector 15 is restrained from making contact with members around the connector 15. Further, the inner protective wall 122 may be formed in the upper case 120 such that the inner protective wall 122 is displaced upward from the outer protective wall 121, the first projecting portion 151 may be extended from the connector body 150 such that the first projecting portion 151 is placed above the outer protective wall 121, and the second projecting portion 152 may be extended from the connector body 150 such that the second projecting portion 152 is placed below the inner protective wall 122. Further, the third and fourth projecting portions 153, 154 may be omitted from the connector 15.

Note that, in the above description, the ESU 10 is provided in the battery electric vehicle 1 including the battery 3 and the motor generator MG, but the ESU 10 is not limited to this. That is, the ESU 10 may be provided in a plug-in hybrid electric vehicle, for example. Further, in the ESU 10, at least any one of the connectors 14, 16 to 19 except the connector 15 or a high-voltage connector provided in a cable to be connected to the battery 3 or the PCU 4 may be attached to the case 100 so as to project rearward from the surface of the case 100, and the protective wall 115 or the like may be provided for at least any one of the connectors 14, 16 to 19.

Figure 6:
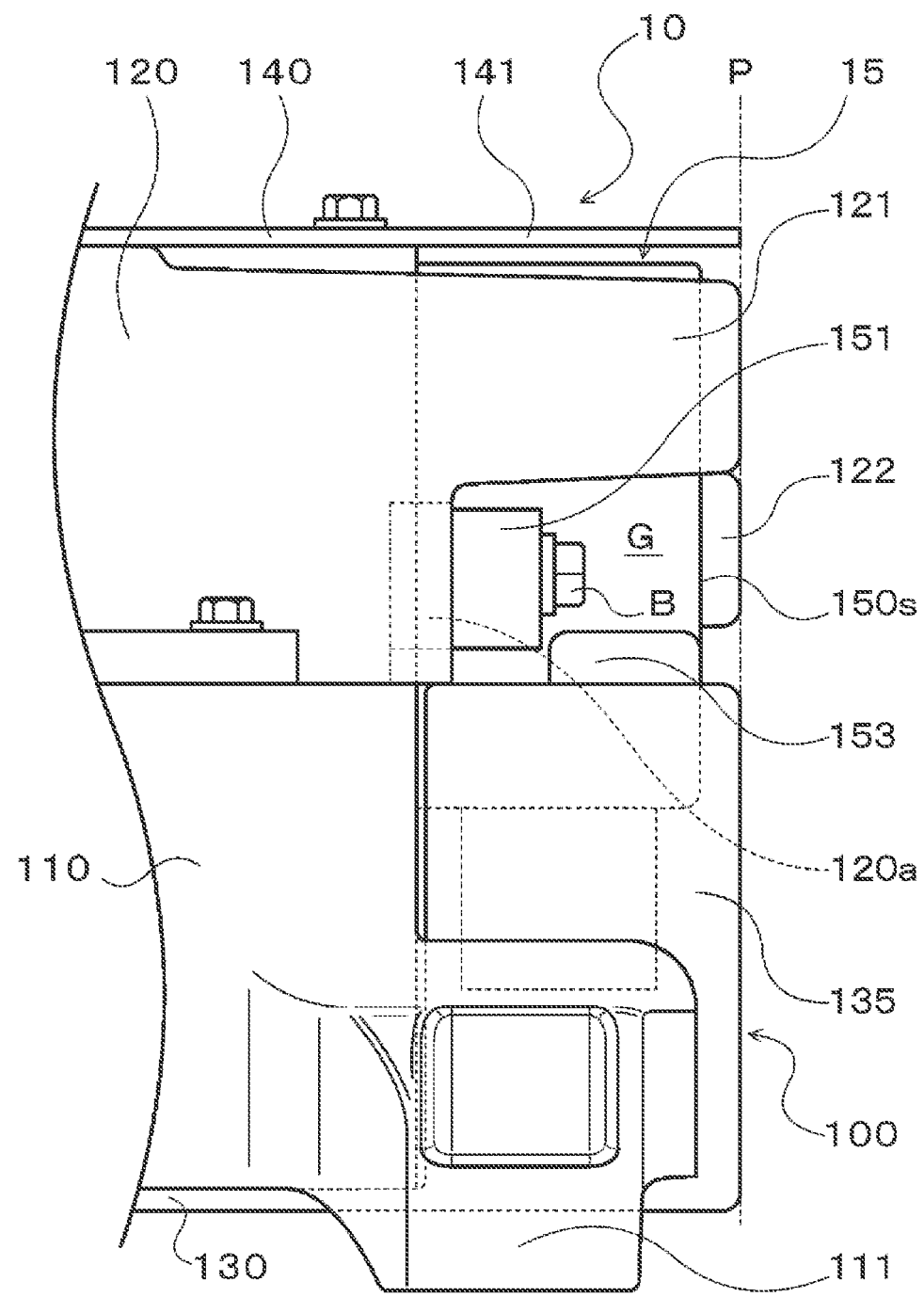
FIG. 6 is an enlarged view illustrating a modification of the in-vehicle electric device according to this disclosure.
Figure 7:
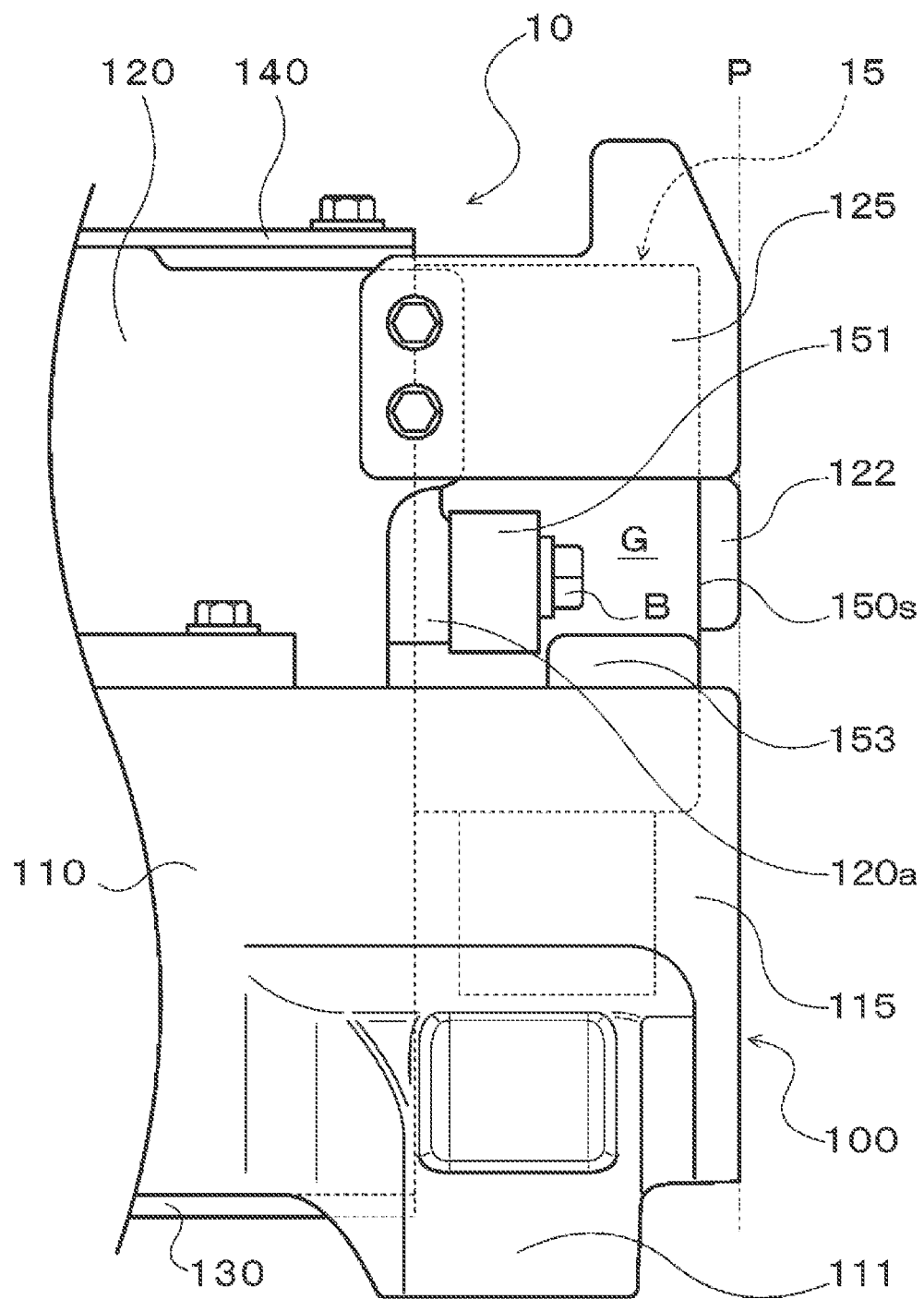
FIG. 7 is an enlarged view illustrating another modification of the in-vehicle electric device according to this disclosure.

Further, in the ESU 10, the outer protective wall 121 of the upper case 120 may be formed integrally with the first boss portion 120a of the upper case 120 as illustrated in FIG. 6. Further, in the ESU 10, the inner protective wall 122 of the upper case 120 may be formed integrally with the second boss portion 120b of the upper case 120. Further, instead of forming the protective wall 115 integrally with any of the fastening portions 111, a protective wall 135 extending upward along the first side face of the connector 15 and projecting further rearward from the rear end surface 150s of the connector 15 may be formed integrally with the lower cover 130, as illustrated in FIG. 6. Further, as illustrated in FIG. 6, a protective wall 141 may be formed in the upper cover 140 such that the protective wall 141 at least partially overlaps with the protective wall 115 of the lower case 110 and the outer protective wall 121 of the upper case 120 when the ESU 10 is viewed from above. The protective wall 141 may cover the whole connector 15 from above or may extend along the whole side wall portion 120w. Further, at least any one of the protective wall 115, the outer protective wall 121, and the inner protective wall 122 may be formed by fixing an additional member to the lower case 110 or the upper case 120. For example, as illustrated in FIG. 7, a collision bracket 125 may be fixed (fastened) to the upper case 120 such that the collision bracket 125 functions as an outer protective wall. The collision bracket 125 is configured such that, when the battery electric vehicle 1 has a collision, the collision bracket 125 is engaged with a tower bar (not illustrated) so as to restrict the ESU 10 from moving forward due to inertia.

The present disclosure of this disclosure is not limited to the above embodiment, and it goes without saying that various alterations can be made within an extensional range of this disclosure. Further, the above embodiment is just one specific aspect of the disclosure described in the field of SUMMARY in every respect and does not limit the elements of the disclosure described in the field of SUMMARY.

The disclosure of this disclosure is applicable in the manufacture industry of the in-vehicle electric device, and so on.

What is claimed is:

1. An in-vehicle electric device including at least one electronic component and a case in which the electronic component is accommodated, the in-vehicle electric device being provided in a front compartment of a vehicle, the in-vehicle electric device comprising:
   a connector connected to the electronic component inside the case and projecting rearward from a surface of the case;
   a fastening portion extended from a lower part of the case and fastened to a vehicle body of the vehicle; and
   a protective wall formed integrally with the fastening portion such that the protective wall extends upward along a first side face of the connector from the lower part of the case and projects further rearward from a rear end surface of the connector, wherein
   the case includes a lower case including the fastening portion and the protective wall, and an upper case connected to an upper end part of the lower case, and
   the upper case includes a second protective wall extending rearward along the first side face of the connector and projecting further rearward from the rear end surface of the connector.

2. The in-vehicle electric device according to claim 1, wherein the protective wall and the second protective wall at least partially overlap with each other when the in-vehicle electric device is viewed from above.

3. The in-vehicle electric device according to claim 1, wherein a gap through which a tool is passable is formed between the protective wall and the second protective wall in an up-down direction.

4. The in-vehicle electric device according to claim 1, wherein the upper case includes a third protective wall extending rearward along a second side face opposite to the first side face of the connector and projecting further rearward from the rear end surface of the connector.

5. The in-vehicle electric device according to claim 4, wherein each of the protective wall, the second protective wall, and the third protective wall is extended from a corresponding one of the lower case and the upper case such that the each of the protective wall, the second protective wall, and the third protective wall reaches a plane facing the rear end surface of the connecter via an interval.

6. The in-vehicle electric device according to claim 4, wherein:
   the vehicle includes an in-vehicle component placed behind the connector via an interval; and
   an interval between the protective wall and the third protective wall in a width direction of the vehicle and an interval between the second protective wall and the third protective wall in the width direction are shorter than a dimension of the in-vehicle component in the width direction.

7. The in-vehicle electric device according to claim 4, wherein:
the second and third protective walls are formed in the upper case such that the second and third protective walls are displaced from each other in an up-down direction; and
the connector includes a connector body placed between the second and third protective walls, a first projecting portion extended from the connector body such that the first projecting portion is placed above or below the second protective wall, and a second projecting portion extended from the connector body such that the second projecting portion is placed below or above the third protective wall.

8. The in-vehicle electric device according to claim 7, wherein:
the third protective wall is formed in the upper case such that the third protective wall is displaced downward from the second protective wall;
the first projecting portion is extended from the connector body such that the first projecting portion is placed below the second protective wall, the first projecting portion being fastened to the upper case;
the second projecting portion is extended from the connector body such that the second projecting portion is placed above the third protective wall, the second projecting portion being fastened to the upper case; and
the connector further includes a third projecting portion extended from the connector body such that the third projecting portion is placed above the protective wall, and a fourth projecting portion extended from the connector body such that the fourth projecting portion is placed below the third protective wall.

9. The in-vehicle electric device according to claim 1, wherein:
the vehicle is an electrified vehicle including an electric machine configured to output a driving force to wheels, and a battery configured to supply electric power to the electric machine; and
the connector is used to connect the in-vehicle electric device to the battery or a power control unit configured to drive the electric machine.

\* \* \* \* \*